(12) United States Patent
Nakamura et al.

(10) Patent No.: US 8,691,377 B2
(45) Date of Patent: Apr. 8, 2014

(54) SEMICONDUCTOR DEVICE

(75) Inventors: Taichi Nakamura, Osaka (JP); Akio Furusawa, Osaka (JP); Shigeaki Sakatani, Osaka (JP); Hidetoshi Kitaura, Osaka (JP); Takahiro Matsuo, Osaka (JP)

(73) Assignee: Panasonic Corporation, Osaka (JP)

( * ) Notice: Subject to any disclaimer, the term of this patent is extended or adjusted under 35 U.S.C. 154(b) by 306 days.

(21) Appl. No.: 13/259,009

(22) PCT Filed: Apr. 22, 2010

(86) PCT No.: PCT/JP2010/002899
§ 371 (c)(1),
(2), (4) Date: Sep. 22, 2011

(87) PCT Pub. No.: WO2010/122795
PCT Pub. Date: Oct. 28, 2010

(65) Prior Publication Data
US 2012/0018890 A1    Jan. 26, 2012

(30) Foreign Application Priority Data

Apr. 22, 2009   (JP) .................................. 2009-103494

(51) Int. Cl.
*H01L 23/488*   (2006.01)
(52) U.S. Cl.
USPC ........... 428/328; 428/323; 257/772; 257/773; 257/779

(58) Field of Classification Search
None
See application file for complete search history.

(56) References Cited

U.S. PATENT DOCUMENTS

| 2001/0050422 A1 | 12/2001 | Kishimoto et al. |
| 2006/0246304 A1 | 11/2006 | Ishihara et al. |

FOREIGN PATENT DOCUMENTS

| JP | 2001-351929 | 12/2001 |
| JP | 2004-533327 | 11/2004 |
| JP | 2005-503926 | 2/2005 |
| JP | 2006-310507 | 11/2006 |
| JP | 2007-109834 | 4/2007 |
| WO | 02/097145 | 12/2002 |
| WO | 03/026828 | 4/2003 |

*Primary Examiner* — Monique Jackson
(74) *Attorney, Agent, or Firm* — Hamre, Schumann, Mueller & Larson, P.C.

(57) ABSTRACT

A semiconductor device of the present invention includes a supporting board, an electrode surface processing layer formed on the supporting board, a semiconductor element, and a solder material containing a first metal composed mainly of bismuth and a second metal having a higher melting point than the first metal and joining the electrode surface processing layer and the semiconductor element, the first metal containing particles of the second metal inside the first metal. The composition ratio of the second metal is higher than the first metal in a region of the solder material corresponding to the center portion of the semiconductor element, and the composition ratio of the second metal is at least 83.8 atomic percent in the region corresponding to the center portion.

6 Claims, 7 Drawing Sheets

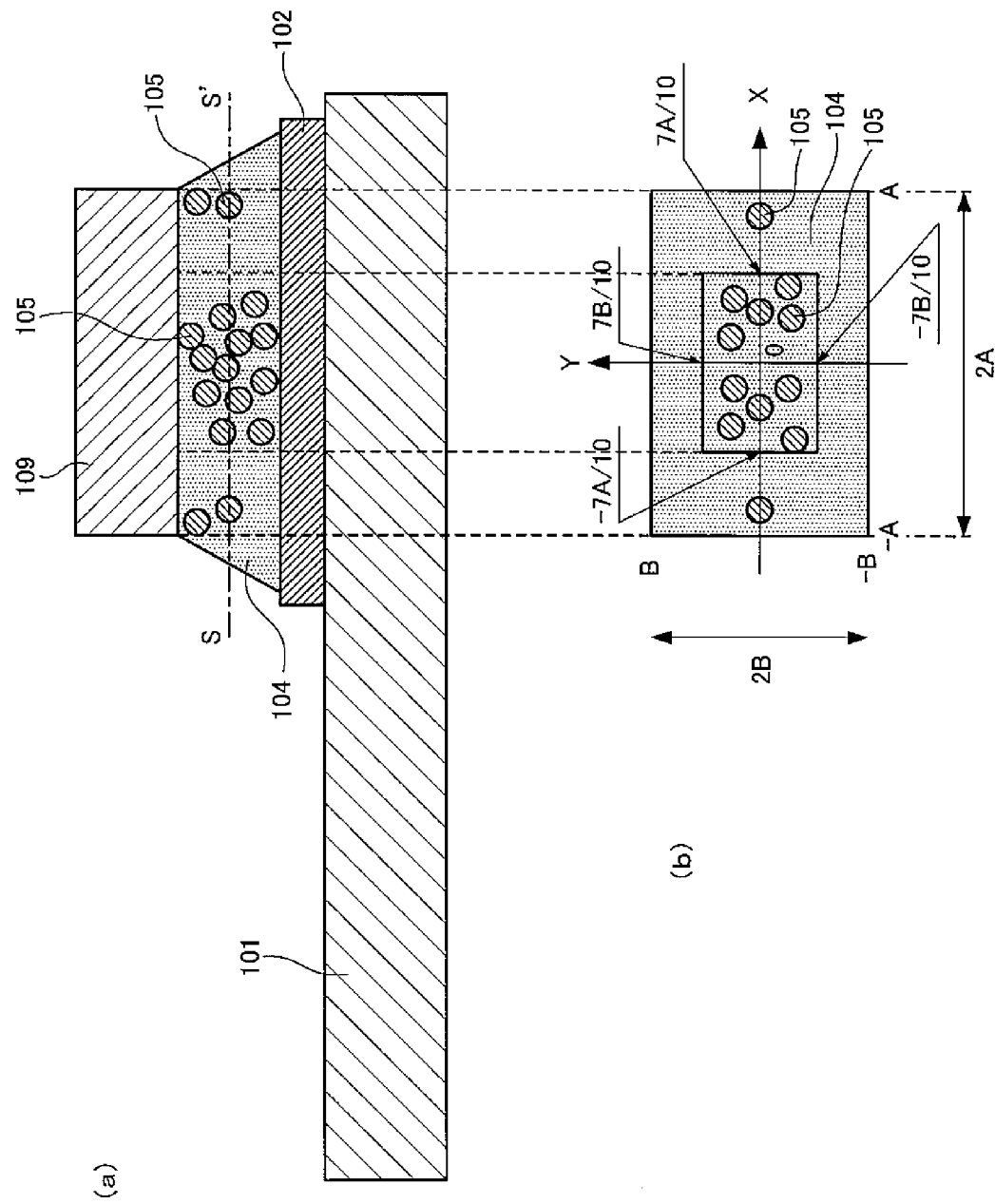

SEMICONDUCTOR DEVICE

TECHNICAL FIELD

The present invention relates to a semiconductor device, particularly to a technique for joining a semiconductor element and a supporting board with a solder material.

BACKGROUND ART

With the growing awareness of environmental protection worldwide, Sn—Ag—Cu lead-free solder has spread as a solder material for mounting an electronic component on a board.

However, lead solder has been still used for, for example, the joining material of inside of an Insulated Gate Bipolar Transistor (IGBT) power module. This is because a solder material used for inside joining of fixing a semiconductor element to the mounting portion of a supporting board does not have to melt at a reflow soldering temperature when joining the module and a mother board. If the solder material used for inside joining remelts at the reflow soldering temperature, the module is short-circuited. The reflow soldering temperature is generally 240° C. to 260° C. Reflow soldering is also called as secondary soldering.

For this reason, lead-free solder which does not melt at a reflow soldering temperature is required. For example, Patent Literature 1 describes high temperature lead-free solder composed mainly of bismuth as a solder material satisfying such a requirement. The high temperature lead-free solder contains about 2% by weight to 18% by weight of silver, about 98% by weight to 82% by weight of bismuth, and up to about 1000 ppm of at least one of zinc, nickel, germanium and a combination of them. Further, the high temperature lead-free solder has a solidus line of not lower than about 262.5° C. and a liquidus line of not higher than about 400° C.

Meanwhile, for example, Patent Literature 2 describes a conductive adhesive as another joining material used for inside joining. The conductive adhesive is obtained by mixing and dispersing Ag filler and particulate resin component to make a paste with a volatile solvent. The content of Ag filler is 90% at the maximum, and the thermal conductivity of the conductive adhesive is 60 W/(m·K) at the maximum.

CITATION LIST

Patent Literature

Patent Literature 1: Japanese Unexamined Patent Application Publication (Translation of PCT Application) No. 2005-503926
Patent Literature 2: Japanese Patent Application Laid-Open No. 2001-351929

SUMMARY OF INVENTION

Technical Problem

However, the solder material of Patent Literature 1 is composed mainly of bismuth. Thus, the thermal conductivity of the solder material of Patent Literature 1 is about 9 W/(m·K), lower than the thermal conductivity of lead solder still used in the market (about 35 W/(m·K)). For example, when a solder material having a thermal conductivity of about 9 W/(m·K) is placed below the heat source of a semiconductor element mounted on an IGBT power module incorporated in a power supply circuit, heat dissipation decreases. For this reason, the solder material of Patent Literature 1 has to be improved in heat dissipation.

Meanwhile, in the conductive adhesive of the above-described Patent Literature 2, the thermal conductivity is increased up to 60 W/(m·K) by increasing the ratio of Ag filler up to 90%. Further, a typical conductive adhesive containing Ag filler has a thermal conductivity of 1.0 W/(m·K) to 1.3 W/(m·K). However, with higher functionality of an electronic device, for example, a semiconductor element mounted on an IGBT power module is required to control a larger current than in the existing semiconductor element. With larger current, the calorific power of a semiconductor element has increased twofold or threefold. For this reason, the joining material for inside joining is required to have a thermal conductivity of 70 W/(m·K) to 100 W/(m·K). Thus, the conductive adhesive of the above-described Patent Literature 2 has to be improved in heat dissipation.

An object of the present invention is to solve the above-described problems. That is, the object of the present invention is to provide a semiconductor device which can improve heat dissipation from a semiconductor element to a supporting board such as a lead frame while obtaining sufficient joint strength between the semiconductor element and the supporting board, and increase the product yield.

Solution to Problem

In order to attain the object, a semiconductor device of the present invention includes: a supporting board; an electrode surface processing layer formed on the supporting board; a semiconductor element; and a solder material containing a first metal composed mainly of bismuth and a second metal having a higher melting point than the first metal and joining the electrode surface processing layer and the semiconductor element, the solder material containing particles of the second metal inside the first metal, wherein the composition ratio of the second metal is higher than the first metal in a region of the solder material corresponding to the center portion of the semiconductor element, the composition ratio of the first metal is higher than the second metal in a region of the solder material outside the region corresponding to the center portion, and the composition ratio of the second metal is at least 83.8 atomic percent (atomic %) in the region corresponding to the center portion.

Advantageous Effects of Invention

According to the present invention, a metal having a high thermal conductivity is disposed below the center portion of the semiconductor element, so that heat from the semiconductor element can be efficiently dissipated from the solder material which is a joining material. Thus, heat dissipation from the semiconductor element to the supporting board can be improved while obtaining sufficient joint strength between the semiconductor element and the supporting board, so that the product yield can be increased.

BRIEF DESCRIPTION OF DRAWINGS

FIGS. 1(a) to 1(e) are schematic cross-sectional views each showing one step of the manufacturing steps of the semiconductor device according to the embodiment, and FIG. 1(f) is a flow chart corresponding to the manufacturing steps of the semiconductor device according to the embodiment.

FIGS. 2(a) to 2(c) are schematic cross-sectional views each showing one state of the state change in the solder material in the manufacturing steps of the semiconductor device according to the embodiment.

FIG. 3(a) is a schematic top view showing the semiconductor device according to the embodiment, and FIG. 3(b) is a schematic cross-sectional view taken along line X-X' in FIG. 3(a).

FIG. 7 is an explanatory diagram showing the composition of the solder material in the semiconductor device according to the embodiment wherein, specifically, FIG. 7(a) is a schematic cross-sectional view of the semiconductor device according to the embodiment as seen from the side, and FIG. 7(b) is a schematic vertical sectional view taken along line S-S' in FIG. 7(a).

DESCRIPTION OF EMBODIMENTS

The following will specifically describe an embodiment of the present invention in accordance with the accompanying drawings. In the present embodiment, a semiconductor device including a semiconductor element and a supporting board joined to each other by a solder material composed mainly of bismuth will be described.

Figure 1:
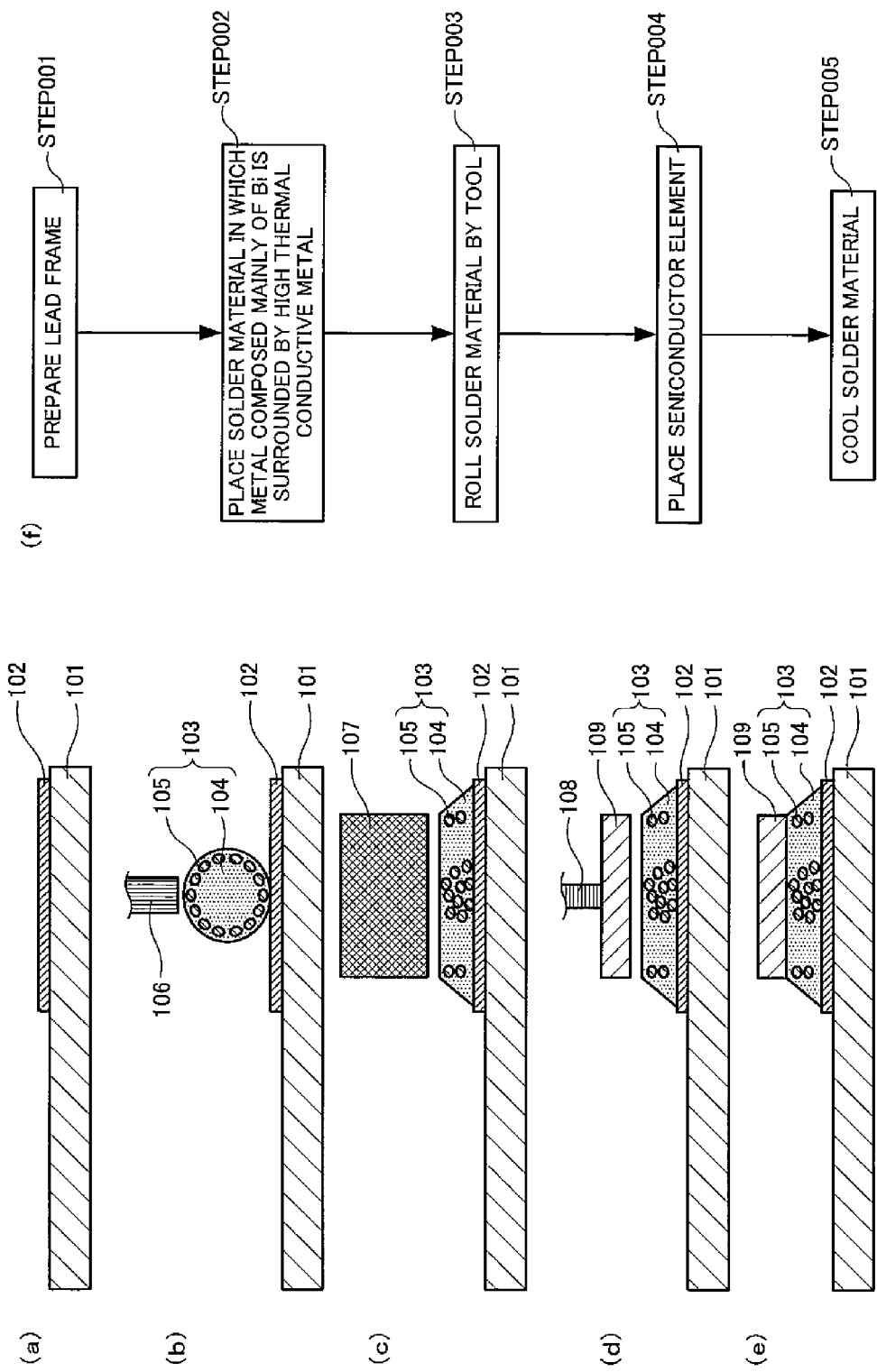
FIG. 1 is a flow chart showing manufacturing steps of a semiconductor device according to an embodiment of the present invention wherein, specifically.

First, manufacturing steps of the semiconductor device according to the present embodiment will be described. FIGS. 1(a) to 1(f) are a flow chart showing the manufacturing steps of the semiconductor device according to the present embodiment. Specifically, FIGS. 1(a) to 1(e) are schematic cross-sectional views showing the manufacturing steps, and FIG. 1(f) is a flow chart showing steps 001 to 005 corresponding to the manufacturing steps. The manufacturing steps are performed to manufacture a semiconductor device including a die bond joint with an excellent thermal conductivity.

Referring to FIG. 1(a), step 001 will be described first. In step 001, a lead frame 101 is prepared as a supporting board. The lead frame 101 is made of a copper alloy. Since a copper alloy has poor wettability with molten bismuth, an electrode surface processing layer made of a material having good wettability with molten bismuth is required for the lead frame 101. Thus, in step 001, the lead frame 101 having an electrode surface processing layer 102 formed on the electrode portion is prepared. The electrode surface processing layer 102 has good wettability with bismuth.

Next, referring to FIG. 1(b), step 002 will be described. In step 002, a solder material 103 composed mainly of bismuth is placed on the center-of-gravity portion of the top surface of the electrode surface processing layer 102 formed on the electrode portion of the lead frame 101.

A method of placing the solder material 103 will be described. First, the lead frame 101 is kept at a temperature at least 30° C. higher than a melting point of bismuth of 271° C. in order to stably melt bismuth. Next, a solder material suction tool 106 sucking a single solder material 103 is moved to place the sucked solder material 103 on the center-of-gravity portion of the top surface of the electrode surface processing layer 102. After that, the sucking of the solder material suction tool 106 is released, and the solder material suction tool 106 is retracted. The solder material 103 has a two-layer structure in which particles of a second metal 105 are dispersed on the outer periphery of a first metal 104 composed mainly of bismuth. The second metal 105 has a higher melting point and thermal conductivity than the first metal 104.

Figure 2:
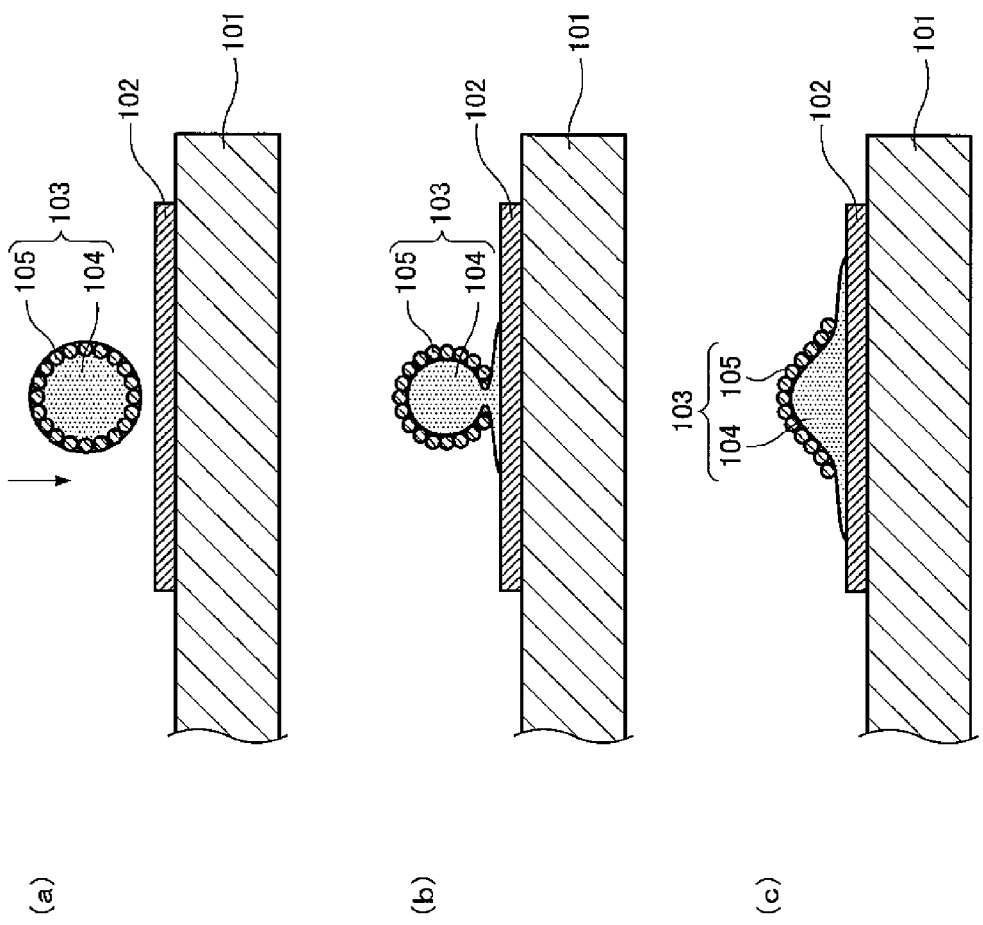
FIG. 2 is schematic cross-sectional views showing a state change in a solder material in the manufacturing steps of the semiconductor device according to the embodiment wherein, specifically.

Referring to FIG. 2, the following will describe the state change of the solder material 103 when the solder material 103 is placed on the electrode surface processing layer 102. FIG. 2 is schematic cross-sectional views showing the state change of the solder material in the manufacturing steps of the semiconductor device according to the present embodiment.

As shown in FIG. 2(a), after the solder material 103 is placed on the electrode surface processing layer 102 of the heated lead frame 101, the first metal 104 of the solder material 103 starts melting as shown in FIG. 2(b). The molten first metal 104 liquates out from the inter-particle gap of particles of the second metal 105 present on the outer periphery of the solder material 103 and moistens the top surface of the electrode surface processing layer 102. Further, after a time has elapsed, as shown in FIG. 2(C), the first metal 104 of the solder material 103 spreads over the electrode surface processing layer 102, and the second metal 105 having a lower specific gravity than the first metal 104 floats to the surface of the solder material 103. At this point, the first metal 104 spreads over the top surface of the electrode surface processing layer 102 centered on the center-of-gravity portion of the top surface of the electrode surface processing layer 102. Thus, the center of the surface of the first metal 104 having spread corresponds to the center-of-gravity portion of the top surface of the electrode surface processing layer 102. Finally, the number of particles of the second metal 105 in the center portion of the surface of the first metal 104 having spread is larger than the number of particles of the second metal 105 around the center portion.

Moreover, any metal other than bismuth may be added to the first metal as long as the metal does not affect the melting point of the first metal. For example, 0.06% by weight of germanium may be added to bismuth.

Next, referring to FIG. 1(c), step 003 will be described. In step 003, the solder material 103 is rolled on the electrode surface processing layer 102 of the lead frame 101. At this point, the solder material 103 is rolled centering around the center-of-gravity portion of the top surface of the electrode surface processing layer 102. Thus, the center of the rolled solder material 103 corresponds to the center-of-gravity portion of the top surface of the electrode surface processing layer 102. In the present embodiment, a rolling tool 107 is lowered to roll the solder material 103 on the electrode surface processing layer 102.

Next, referring to FIG. 1(d), step 004 will be described. In step 004, a semiconductor element 109 is placed on the rolled solder material 103. At this point, the semiconductor element 109 is placed such that the center of the under surface (surface facing the electrode surface processing layer 102) of the semiconductor element 109 is aligned with the center-of-gravity portion of the top surface of the electrode surface processing layer 102. In the present embodiment, a semiconductor element suction tool 108 sucking the semiconductor element 109 is moved to place the sucked semiconductor element 109 on the rolled solder material 103 on the electrode surface processing layer 102. After the semiconductor element 109 is placed, the sucking of the semiconductor element suction tool 108 is released, and the semiconductor element suction tool 108 is retracted.

Next, referring to FIG. 1(e), step 005 will be described. In step 005, the solder material 103 is cooled and solidified to join the electrode surface processing layer 102 on the lead frame 101 and the semiconductor element 109.

Figure 3:
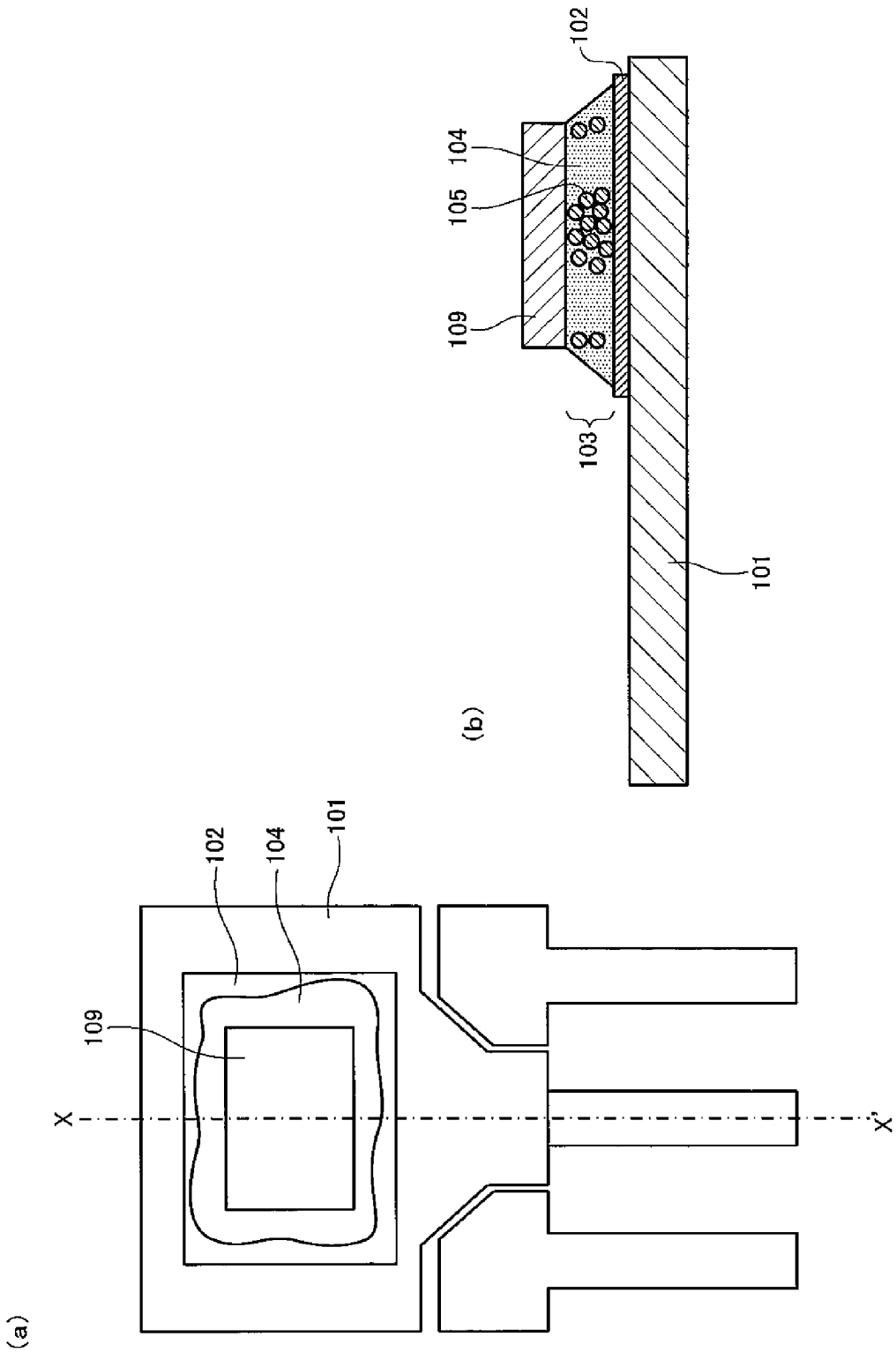
FIG. 3 is schematic views showing the semiconductor device according to the embodiment wherein, specifically.

The following will describe the semiconductor device according to the present embodiment. FIGS. 3(a) and 3(b) are schematic views showing the semiconductor device according to the present embodiment. Specifically, FIG. 3(a) is a schematic top view showing the semiconductor device, and FIG. 3(b) is a schematic cross-sectional view taken along line X-X' of FIG. 3(a). As shown in FIG. 3(b), in the center portion of a die bond joint (solder material joint) joining the semiconductor element 109 and the lead frame 101, the second metal 105 is higher in proportion than the first metal 104, whereas outside the center portion, the first metal 104 is higher in proportion than the second metal 105. The center portion of the die bond joint corresponds to the center portion of the semiconductor element 109.

The following will describe an example according to the present embodiment in the order of the above-described steps. Further, in this example, an IGBT power module including a silicon semiconductor element was manufactured.

First, referring to FIG. 1(a), step 001 will be described. In this example, silver was deposited with a thickness of 3 μm as the electrode surface processing layer 102 on the electrode portion (not shown) with a top surface size of 4.5 mm×5.5 mm on the lead frame 101 by electroplating. In the present example, silver was deposited with a thickness of 3 μm as the electrode surface processing layer 102, but metals having good wettability with molten bismuth, such as gold, nickel, cobalt, and zinc may be used with a thickness of at least 1 μm in consideration of a variation in thickness of 1 μm.

Next, referring to FIG. 1(b), step 002 will be described. The solder material 103 used in this example was sphere-shaped with a diameter of 1 mm, and copper particles with an average particle diameter of 3 μm as the second metal 105 were dispersed on the outer periphery of the sphere-shaped first metal 104. The first metal 104 was composed mainly of bismuth. The solder material 103 was placed on the center-of-gravity portion of the top surface of the electrode surface processing layer 102. The average particle diameter of copper particles was calculated from particle diameters and roundness measured by an optical particle size analyzer.

Spherodization in oil has been commonly known as a method of manufacturing a sphere-shaped solder material. The spherodization in oil is described in, for example, Japanese Patent Application Laid-Open No. 2000-328112. The spherodization in oil was used also in this example. Specifically, first, a 1 kg ingot alloy of Bi—8% by weight Cu having a uniformly dispersed composition was put in a pot, and the overall pot was heated to 500° C. by a heating unit. Since the melting points of copper and bismuth are 1083° C. and 271° C., respectively, only bismuth melted in the pot. Next, the alloy in which only bismuth melted was discharged from a nozzle having an opening with a diameter of 0.5 mm immersed in oil at the pot end, and the alloy was solidified in the oil at a cooling rate of 250° C./min. In the solidification process in the oil, copper was dispersed on the outer periphery of molten bismuth, and bismuth was solidified while segregating. This is because copper having a higher melting point than bismuth was pushed out from the inside of the discharged alloy to the outer periphery of the alloy, and bismuth was solidified in the inside of the alloy.

The solder material 103 produced by such a method, as shown in FIG. 1(b), had copper particles with an average particle diameter of 3 μm as the second metal 105 dispersed on the outer periphery of the sphere-shaped first metal 104. Further, the diameter of the solder material 103 was 1 mm (tolerance of within ±50 μm, process capability index Cpk=3.77).

Table 1 shows the composition of a solder material, the type of a first metal, the type of a second metal, the possibility of discharge of a solder material through the nozzle, the diameter of a solder material, and the average particle diameter of a second metal in Examples 1 to 6 and Comparative Examples 1 to 6 of solder materials produced by the spherodization in oil. Further, the present example is Example 1 of Table 1.

The diameters of the solder materials were measured by cross-sectional observation. In Examples 1 to 6 and Comparative Examples 5 to 6, the nozzle having an opening with a diameter of 0.5 mm was used, and in Comparative Examples 1 to 4, a nozzle having an opening with a diameter of 0.7 mm was used.

TABLE 1

| | Solder material composition | First metal | Second metal | Possibility of discharge | Solder material diameter | Second metal average particle diameter |
|---|---|---|---|---|---|---|
| Example 1 | Bi—8% by weight Cu | Bi | Cu | Possible | 1 mm | 3 μm |
| Example 2 | Bi—2% by weight Cu | Bi | Cu | Possible | 1 mm | 2.8 μm |
| Example 3 | Bi—8% by weight Ag | Bi | Ag | Possible | 1 mm | 2.7 μm |
| Example 4 | Bi—4% by weight Cu—4% by weight Ag | Bi | Cu, Ag | Possible | 1.01 mm | 3.1 μm |
| Example 5 | Bi—8% by weight Zn | Bi | Zn | Possible | 1.02 mm | 2.5 μm |
| Example 6 | Bi—4% weight Cu—4% by weight Zn | Bi | Cu, Zn | Possible | 1.01 mm | 2.3 μm |
| Comparative Example 1 | Bi—10% by weight Cu | Bi | Cu | Impossible | (1.21 mm) | — |
| Comparative Example 2 | Bi—9% by weight Cu | Bi | Cu | Impossible | (1.19 mm) | — |
| Comparative Example 3 | Bi—10% by weight Ag | Bi | Ag | Impossible | (1.22 mm) | — |
| Comparative Example 4 | Bi—5% by weight Cu—5% by weight Ag | Bi | Cu, Ag | Impossible | (1.23 mm) | — |
| Comparative Example 5 | Bi—8% by weight Sn | Bi | Sn | Possible | 0.9 mm | Not dispersed on outer periphery |
| Comparative Example 6 | Bi—8% by weight In | Bi | In | Possible | 1.03 mm | Not dispersed on outer periphery |

As shown in Examples 1 to 6 of Table 1, when one or two were selected as the second metal 105 from copper, silver, and zinc and the amount of the added second metal 105 (the total amount of two elements, when the two elements were selected) was set at 2% by weight to 8% by weight, the solder material could be discharged from the nozzle having an opening with a diameter of 0.5 mm. Further, particles of the second metal 105 were dispersed with an average particle diameter of 2.3 µm to 3 µm on the outer periphery of the first metal 104 composed mainly of bismuth.

Meanwhile, as shown in Comparative Examples 1 to 4 of Table 1, when one or two were selected as the second metal 105 from copper and silver and the amount of the added second metal 105 (the total amount of two elements, when the two elements were selected) was set at not less than 9% by weight, the nozzle having an opening with a diameter of 0.5 mm was clogged, so that the solder material could not be discharged. In this case, if the nozzle having an opening with a diameter of 0.7 mm was used, the solder material could have been discharged but the diameter of the solder material was from 1.19 mm to 1.23 mm, larger than those in Examples 1 to 6. Thus, when the nozzle having an opening with a diameter of 0.7 mm was used, the amount of supplied solder increased. With an increase in the amount of supplied solder, in step 003, the solder material 103 may spread out of the electrode surface processing layer 102, and the solder material spread out of the electrode surface processing layer 102 may turn around to the back surface of the lead frame 101 to interrupt the subsequent steps. For this reason, the amount of the added second metal 105 is desirably not more than 8% by weight.

Further, as shown in Comparative Examples 5 to 6 of Table 1, when tin or indium was selected as the second metal 105 and the amount of the added second metal 105 was set at 8% by weight, the second metal 105 was dispersed not on the outer periphery of the first metal 104 but over the inside of the first metal 104. This is because tin and indium have melting points of 232° C. and 157° C., respectively, lower than a melting point of bismuth of 271° C. Specifically, in the solidification process of the manufacture of a solder ball, bismuth having a high melting point was first solidified, and tin or indium was then solidified, so that particles of tin or indium were dispersed over the inside of bismuth as the first metal 104. Thus, the second metal 105 has to have a higher melting point than that of bismuth.

Moreover, lead solder (for example, Pb—3% by weight Sn), which is a joining material in a typical semiconductor component, has a thermal conductivity of 35 W/(m·K). In the present embodiment, the solder material 103 is required to have a thermal conductivity of at least 35 W/(m·K).

As described above, the second metal 105 has to have a thermal conductivity of at least 35 W/(m·K) which is the thermal conductivity of Pb—3% by weight Sn and have a higher melting point than that of bismuth. Metals satisfying these conditions include silver, copper, gold, aluminum, and zinc. Thus, one or two may be selected as the second metal 105 from silver, copper, gold, aluminum, and zinc. In Examples 1 to 6, silver, copper, and zinc were used. However, the melting points of gold and aluminum are 1064° C. and 660° C., respectively, higher than a melting point of bismuth of 271° C., and the thermal conductivities of gold and aluminum are 317 W/(m·K) and 237 W/(m·K), respectively, higher than a thermal conductivity of lead of 35 W/(m·K). Thus, gold and aluminum are appropriate for the second metal 105.

Out of silver, copper, gold, aluminum, and zinc, particularly silver and copper have higher thermal conductivities. Thus, when one or two are selected as the second metal from silver and copper, heat dissipation from the semiconductor element 109 to the lead frame 101 is expected to improve.

However, the eutectic temperature of silver added to bismuth becomes 262° C., at least 9° C. lower than the melting point of bismuth. For this reason, the solder material is likely to be remolten at a reflow soldering temperature. The reflow soldering temperature is generally 240° C. to 260° C. In contrast, since the eutectic temperature of copper added to bismuth is 270° C., the solder material is less likely to be remolten during reflow soldering.

As described above, particularly, the second metal 105 of the solder material 103 is desirably copper. The amount of the added second metal 105 has to be not more than 8% by weight. Thus, it is desirable that the solder material 103 be composed mainly of bismuth with 8% by weight of copper added thereto (Bi—8% by weight Cu) and be sphere-shaped with a diameter of 1 mm.

Further, in step 002 of placing the solder material 103 on the center-of-gravity portion of the top surface of the electrode surface processing layer 102, the oxygen concentration of a space has to be reduced to suppress the oxidization of the electrode surface processing layer 102 on the lead frame 101 and the solder material 103. The oxygen concentration has to be reduced since the solder material 103 does not contain a flux composition. The reduction of the oxygen concentration makes it possible to satisfactorily join (solder) the solder material 103 to the electrode surface processing layer 102 on the heated lead frame 101.

Figure 4:
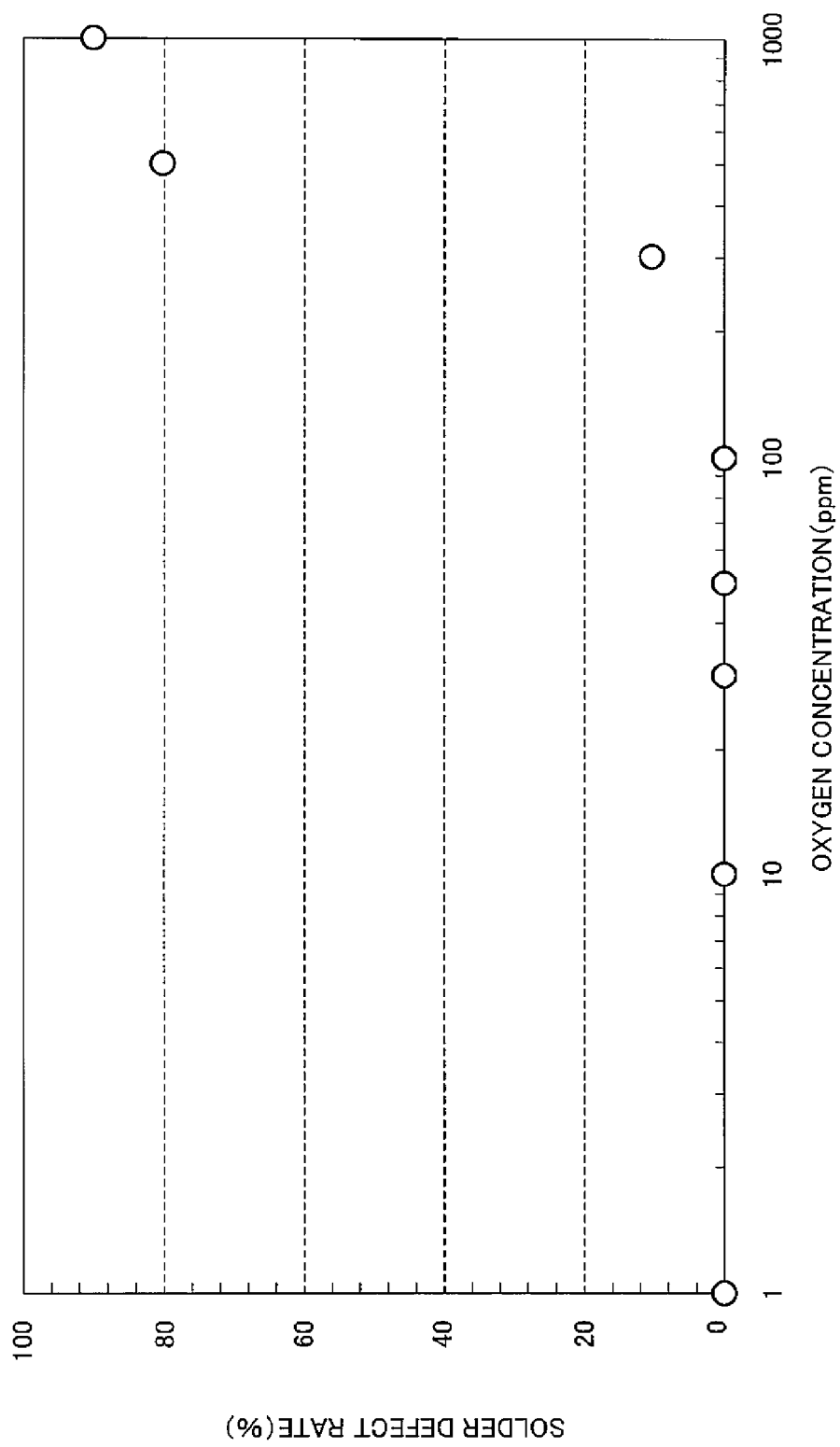
FIG. 4 shows the relationship between oxygen concentrations and solder defect rates in the manufacturing steps of the semiconductor device according to the embodiment.

FIG. 4 shows the relationship between oxygen concentrations and solder defect rates, when the lead frame 101 was kept at a temperature of 320° C. and the solder material 103 was placed on the electrode surface processing layer 102 by the solder material suction tool 106 made of stainless steel with an opening diameter of 0.5 mm with a load of 30 gf. In FIG. 4, the oxygen concentrations (ppm) are plotted along the abscissa, and the solder defect rates are plotted along the ordinate. The solder defects include scattering of solder and unwetting caused when the surface of the electrode surface processing layer 102 and the surface of the solder material 103 are difficult to be joined to each other. Further, the solder defect rates at the oxygen concentrations were calculated with the number of samples set to 10.

It is noted from FIG. 4 that since solder defects did not occur at oxygen concentrations of 1 ppm, 10 ppm, 30 ppm, 50 ppm, and 100 ppm, favorable soldering was achieved. At oxygen concentrations of 500 ppm and 1000 ppm, the solder defect rates were high and at least 80%. This is because oxide films on the surface of the electrode surface processing layer 102 on the lead frame 101 and the surface of the solder material 103 become thick, thereby making it difficult to join the lead frame 101 and the solder material 103. Further, it is desirable that the oxygen concentration be low but it is difficult to lower the oxygen concentration to below 1 ppm by the control performance of equipment. For this reason, the oxygen concentration is preferably selected from a range of 1 ppm to 300 ppm at which the solder defect rate is not more than 10%. In the present example, the oxygen concentration was 50 ppm. Also in steps 003 and 004, the oxygen concentration was 50 ppm.

Further, the lead frame 101 has to be kept at a temperature at which the first metal 104 melts but the second metal 105 does not melt. Since the first metal 104 composed mainly of bismuth has a melting point of 271° C., it is essential to set the lower limit of heating temperature of the lead frame 101 at least 30° C. higher than the melting point of bismuth to stably melt bismuth. Desirably, a safety margin is added to the lower limit. Specifically, the lower limit is desirably at least 310° C.

Meanwhile, the upper limit of heating temperature of the lead frame 101 is preferably set at least 30° C. lower than the melting point of the second metal 105 to reliably prevent the second metal 105 from melting. Desirably, a safety margin is added to the upper limit. Specifically, out of silver, copper, gold, aluminum, and zinc, zinc has the lowest melting point of 420° C. Thus, desirably, the upper limit of heating temperature of the lead frame 101 is not more than 380° C. In the present example, the heating temperature of the lead frame 101 was set at 320° C., about 50° C. higher than the melting point of bismuth. This is because enhancement in the wettability of bismuth and unstable temperature control of a heating source were considered. Also in steps 003 and 004, the heating temperature of the lead frame 101 was set at 320° C.

Figure 5:
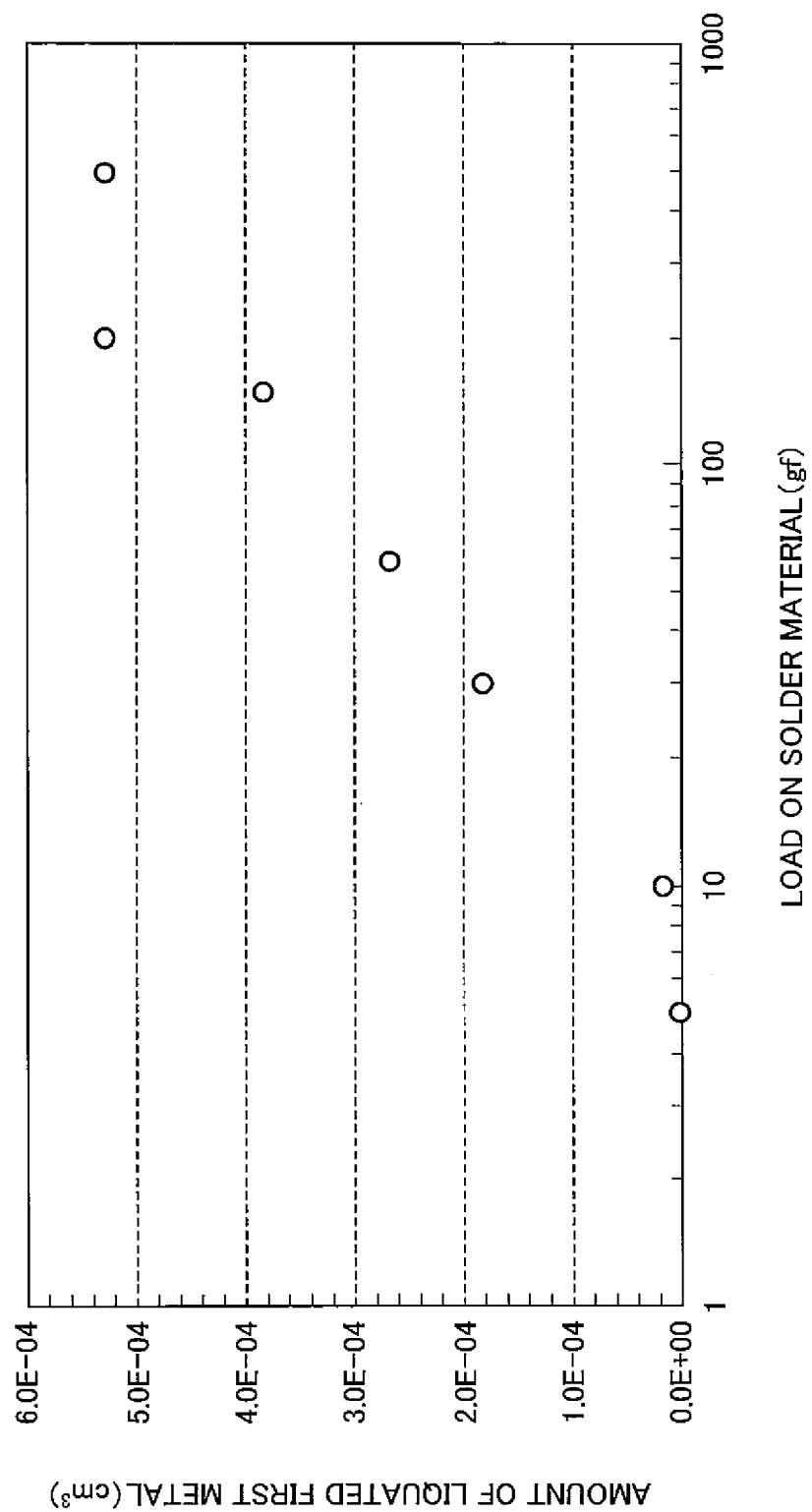
FIG. 5 shows the relationship between loads on the solder material and amounts of a liquated first metal in the manufacturing steps of the semiconductor device according to the embodiment.

Moreover, the load on the solder material 103 has to be set such that the first metal 104 composed mainly of bismuth liquates out from the inter-particular gap of copper particles with an average particle diameter of 3 μm as the second metal 105. FIG. 5 shows the relationship between loads on the solder material 103 and amounts of the first metal liquated out to the electrode surface processing layer 102. Specifically, FIG. 5 shows the relationship between the loads on the solder material 103 and the amounts of the liquated first metal 104 when the lead frame 101 was kept at 320° C., the oxygen concentration of a space was set at 50 ppm, and the solder material 103 was used which has a composition of Bi—8% by weight Cu and is sphere-shaped with a diameter of 1 mm. In FIG. 5, the loads on the solder material are plotted along the abscissa, and the amounts of the liquated first metal 104 ($cm^3$) are plotted along the ordinate.

It is noted from FIG. 5 that when the load was at least 10 gf, the amount of the liquated first metal 104 was at least $0.1414 \times 10^{-4}$ $cm^3$, and the first metal 104 composed mainly of bismuth liquated out from the inter-particular gap of copper particles with an average particle diameter of 3 μm as the second metal 105 and spread over the electrode surface processing layer 102. However, it is found that when the load was 200 gf or 500 gf, the liquated first metal 104 clogged the opening of the solder material suction tool 106. For this reason, the load is preferably 10 gf to 150 gf. In the present example, the load was set at 30 gf.

Next, referring to FIG. 1(c), step 003 will be described. In the present example, the rectangular rolling tool 107 was lowered vertically towards the solder material 103 placed on the electrode surface processing layer 102 on the lead frame 101 to roll the solder material 103 on the electrode surface processing layer 102. The lead frame 101 was kept at 320° C. and the oxygen concentration of the space was set at 50 ppm. The rolling tool 107 was made of cemented carbide with a top surface size of 3.5 mm×4.5 mm and a height of 30 mm. The material of the rolling tool is preferably a metal material which does not dissolve in the solder material 103 and does not melt within a range of 310° C. to 380° C. Materials meeting these conditions include SUS materials such as SUS304 and SUS316. The area of the rolled solder material 103 is set not smaller than the area of the under surface of the semiconductor element 109 to be placed afterwards but not larger than the area of the top surface of the electrode surface processing layer 102. For this reason, the area of the bottom surface of the rolling tool 107 also has to be set not smaller than the area of the under surface of the semiconductor element 109 to be placed afterwards but not larger than the area of the top surface of the electrode surface processing layer 102.

Figure 6:
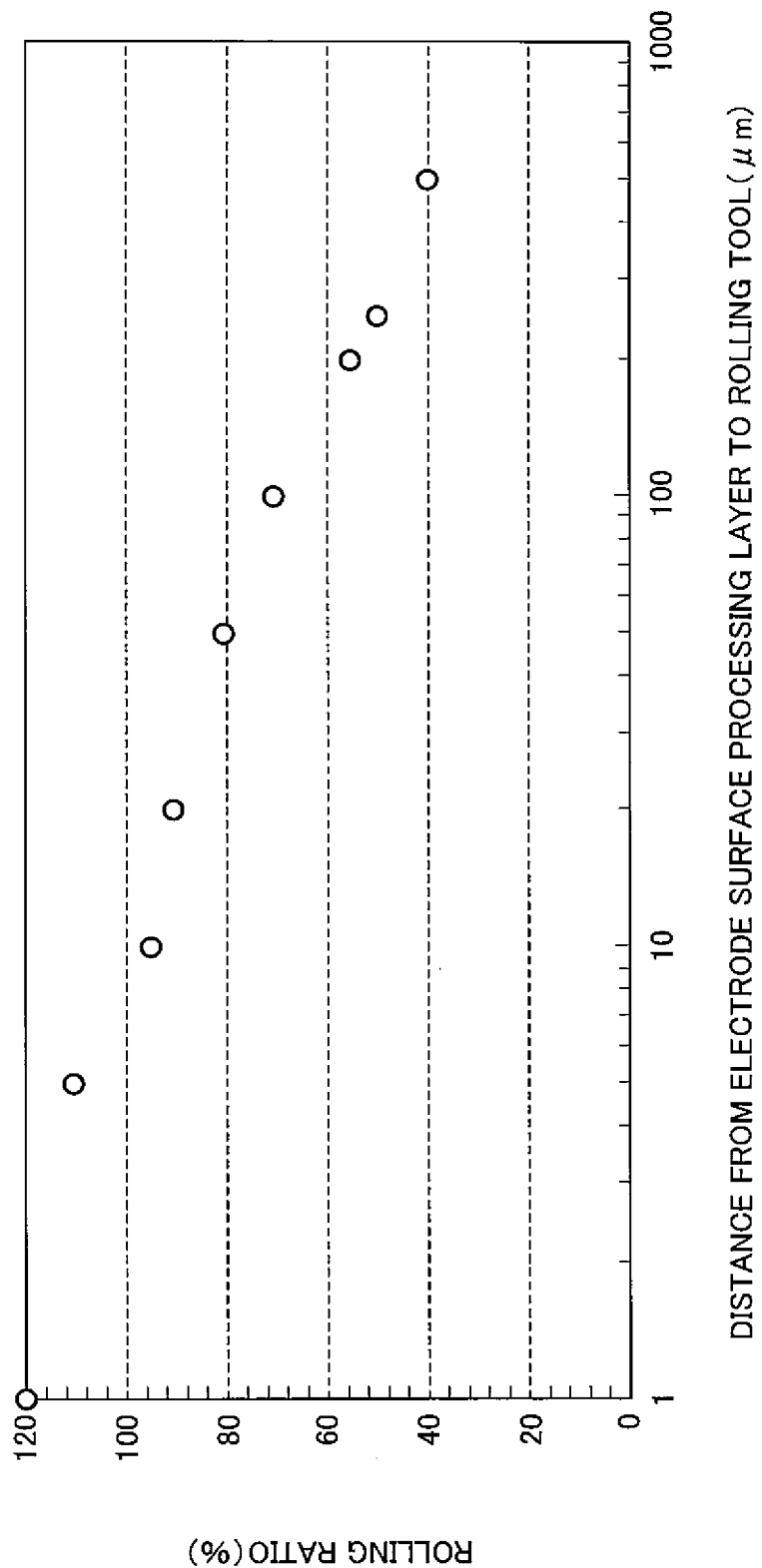
FIG. 6 shows the relationship between a distance from an electrode surface processing layer to a rolling tool and a rolling ratio in the manufacturing steps of the semiconductor device according to the embodiment.

FIG. 6 shows the relationship between the distance from the top surface of the electrode surface processing layer 102 to the bottom surface of the lowered rolling tool 107 and the rolling ratio of the solder material 103. In FIG. 6, distances (μm) from the top surface of the electrode surface processing layer 102 to the bottom surface of the lowered rolling tool 107 are plotted along the abscissa, and the rolling ratios (%) are plotted along the ordinate. The rolling ratios of the solder material 103 were calculated by the following formula:

$$\text{Rolling ratio} = ((\text{surface area of spread solder material } 103) \div (\text{area of top surface of electrode surface processing layer } 102)) \times 100 (\%)$$

wherein the area of the top surface of the electrode surface processing layer 102 is 4.5×5.5=24.75 $mm^2$. Further, the area of the under surface of the semiconductor element 109 to be placed afterwards is 3.5×4.5=15.75 $mm^2$. Thus, in order that the area of the rolled solder material 103 is not smaller than the area of the under surface of the semiconductor element 109 but not larger than the area of the top surface of the electrode surface processing layer 102, the rolling ratio has to be at least 63.6% (15.75÷24.75×100) but not more than 100%. When the rolling ratio is 63.6%, the solder material 103 is rolled to have the same area as that of the under surface of the semiconductor element 109, and when the rolling ratio is 100%, the solder material 103 is rolled to have the same area as that of the top surface of the electrode surface processing layer 102.

It is noted from FIG. 6 that when the distance from the top surface of the electrode surface processing layer 102 to the bottom surface of the lowered rolling tool 107 is not larger than 100 μm, the rolling ratio is at least 63.6%. It is also noted that when the distance is 1 μm or 5 μm, the rolling ratio is at least 100%. When the rolling ratio is at least 100%, the solder material 103 spreads beyond the area of the top surface of the electrode surface processing layer 102. Thus, in this case, the solder material having spread out of the electrode surface processing layer 102 may turn around to the back surface of the lead frame 101 to interrupt the subsequent steps. For this reason, the distance from the top surface of the electrode surface processing layer 102 to the bottom surface of the lowered rolling tool 107 is desirably 10 μm to 100 μm. In the present example, the distance from the top surface of the electrode surface processing layer 102 to the bottom surface of the lowered rolling tool 107 was 20 μm.

Since the melting points of copper and bismuth are 1083° C. and 271° C., respectively, when the lead frame 101 is kept at 320° C., only bismuth melts. Thus, the rolling tool 107 is lowered vertically towards the electrode surface processing layer 102, so that the first metal 104 composed mainly of bismuth in the solder material 103 can be rolled and copper particles with an average particle diameter of 3 μm as the second metal 105 can be kept at a position where the solder material 103 is placed.

Next, referring to FIG. 1(d), step 004 will be described. In the present example, the semiconductor element suction tool 108 sucking the semiconductor element 109 was moved to place the sucked semiconductor element 109 on the rolled solder material 103 on the electrode surface processing layer 102 without a load. A diffusion barrier layer and a silver layer were deposited by vacuum evaporation in this order with thicknesses of 1 μm and 1.5 μm, respectively, on the surface (under surface) of the semiconductor element 109 facing the solder material 103. The semiconductor element suction tool 108 was made of a stainless steel SUS304. However, tools made of other SUS materials such as SUS316 may be used. Further, the semiconductor element 109 was made of silicon and obtained by cutting a wafer with a diameter of 6 inches and a thickness of 0.3 mm to have a dimension of 3.5 mm×4.5 mm.

Next, referring to FIG. 1(e), step 005 will be described. In the present example, the lead frame 101 was cooled to a room temperature to solidify the solder material 103, so that the electrode surface processing layer 102 on the lead frame 101 and the semiconductor element 109 were joined to each other. The oxygen concentration of the space is preferably 1 ppm to 300 ppm. In this example, the oxygen concentration of the space was 50 ppm.

Subsequently, referring to FIG. 7 and Table 2, the characteristics of the semiconductor device according to the present embodiment will be described. Examples 1 to 6 of Table 2 share the above-described manufacturing method but are different from each other only in the composition of the solder material. The above-described Example is Example 1 of Table 2. As regards the manufacturing methods, Examples 1 to 6 and Comparative Examples 7 to 12 are different only in the method of placing the solder material in step 002, but are the same in the amount of the supplied solder material and the other steps. Examples 1 to 6 and Comparative Examples 7 to 12 are the same in the compositions of the solder material.

FIG. 7 is an explanatory drawing showing the composition of the solder material in the semiconductor device according to the present embodiment. Specifically, FIG. 7(a) shows the cross-sectional structure of the semiconductor device according to the present embodiment as seen from the side, and FIG. 7 (b) shows the vertical sectional structure taken along line S-S' in FIG. 7(a). Table 2 shows the distribution of compositions of the solder material, the thermal conductivities of the solder material and the yields of the semiconductor device after the semiconductor element is joined onto the lead frame. The distribution of compositions of the solder material is expressed in composition ratios at the center portion and on the outer periphery of the die bond joint (solder material joint) joining the lead frame and the semiconductor element. The product yields of the semiconductor device were calculated by joining the semiconductor element onto the lead frame, completing the steps, assembling an IGBT power module, and conducting an operation test.

As shown in FIGS. 7(a) and 7(b), the outer shape of the surface (under surface) of the semiconductor element 109 facing the electrode surface processing layer 102 is quadrangular. In the outer shape, the lengths of two sides (longer sides) opposed to each other in one direction are referred to as 2A, and the lengths of two sides (shorter sides) opposed to each other in the other direction are referred to as 2B. A straight line connecting the midpoints of the shorter sides with length 2B is set as an X-axis, a straight line connecting the midpoints of the longer sides with length 2A is set as a Y-axis, the intersection of the X-axis and the Y-axis is set as an origin O (X=0, Y=0), and an X-Y coordinate plane is formed. In the X-Y coordinate plane, a region surrounded by straight lines of X=±7A/10 and Y=±7B/10 and a region outside the region surrounded by the straight lines are set as a center portion and an outer periphery, respectively. The ratios of the first metal 104 to the second metal 105 in regions of the solder material 103 corresponding to the set center portion and outer periphery were measured. As a result, in Examples 1 to 6 of Table 2, the ratio of the second metal 105 was higher than the first metal 104 in the region of the solder material 103 corresponding to the center portion (the center portion of the die bond joint), and the ratio of the first metal 104 was higher than the second metal 105 in the region of the solder material 103 corresponding to the outer periphery (the outer periphery of the die bond joint).

The method of placing the solder material in Comparative Examples was potting which is typical die bonding. In potting, the molten solder material 103 is placed on the electrode surface processing layer 102 on the lead frame 101 by a dispenser.

It is noted from Table 2 that the product yields after assembling were 85% to 100% in Examples but 20% to 30% in Comparative Examples, 55% to 80% lower than Examples, even though they shared the same solder material composition.

The product yields were higher in Examples for the following reason. In the manufacturing method of Examples, the

TABLE 2

| | Solder materiel composition | First metal | Second metal | Center portion composition | Outer periphery composition | Thermal conductivity | Product yield | Manufacturing method |
|---|---|---|---|---|---|---|---|---|
| Example 1 | Bi—8% by weight Cu | Bi | Cu | 10.2 atom % Bi—89.8 atom % Cu | 98.5 atom % Bi—0.5 atom % Cu | 158 W/(m * K) | 100% | Manufacturing method according to embodiment of present invention |
| Example 2 | Bi—2% by weight Cu | Bi | Cu | 15.9 atom % Bi—84.1 atom % Cu | 97.2 atom % Bi—2.8 atom % Cu | 136 W/(m * K) | 95% | |
| Example 3 | Bi—8% by weight Ag | Bi | Ag | 16.2 atom % Bi—83.8 atom % Ag | 99 atom % Bi—1 atom % Ag | 140 W/(m * K) | 95% | |
| Example 4 | Bi—4% by weight Cu—4% by weight Ag | Bi | Cu, Ag | 15.3 atom % Bi—45 atom % Cu—39.7 atom % Ag | 98.1 atom % Bi—1.2 atom % Ag—0.7 atom % Cu | 150 W/(m * K) | 100% | |
| Example 5 | Bi—8% by weight Zn | Bi | Zn | 13.2 atom % Bi—86.8 atom % Zn | 97.5 atom % Bi—2.5 atom % Zn | 103 W/(m * K) | 80% | |
| Example 6 | Bi—4% by weight Cu—4% by weight Zn | Bi | Cu, Zn | 16 atom % Bi—45 atom % Cu—39 atom % Zn | 98 atom % Bi—1 atom % Cu—1 atom % Zn | 120 W/(m * K) | 85% | |
| Comparative Example 7 | Bi—8% by weight Cu | — | — | 95 atom % Bi—5 atom % Cu | 93.8 atom % Bi—6.2 atom % Cu | 11 W/(m * K) | 30% | Potting |
| Comparative Example 8 | Bi—2% by weight Cu | — | — | 95.2 atom % Bi—4.8 atom % Cu | 94 atom % Bi—6 atom % Cu | 9.9 W/(m * K) | 25% | |
| Comparative Example 9 | Bi—8% by weight Ag | — | — | 95.2 atom % Bi—4.8 atom % Ag | 94 atom % Bi—6 atom % Ag | 10 W/(m * K) | 25% | |
| Comparative Example 10 | Bi—4% by weight Cu—4% by weight Ag | — | — | 95.2 atom % Bi—2.5 atom % Cu—2.3 atom % Ag | 93.8 atom % Bi—3.2 atom % Ag—3 atom % Cu | 10.2 W/(m * K) | 25% | |
| Comparative Example 11 | Bi—8% by weight Zn | — | — | 97.6 atom % Bi—2.4 atom % Zn | 95 atom % Bi—5 atom % Zn | 9.7 W/(m * K) | 20% | |
| Comparative Example 12 | Bi—4% by weight Cu—4% by weight Zn | — | — | 95.2 atom % Bi—2.5 atom % Cu—2.3 atom % Zn | 94 atom % Bi—3.1 atom % Cu—2.9 atom % Zn | 9.8 W/(m * K) | 20% | | solder material 103 was used in which particles of the second metal 105 with thermal conductivities of 121 W/(m·K) to 427 W/(m·K) were dispersed on the outer periphery of the first metal 104 composed mainly of bismuth. Thus, when the solder material 103 was placed on the heated lead frame 101, the first metal 104 spread, and the number of particles of the second metal 105 with high thermal conductivities at the center portion of the surface of the spread first metal 104 was larger than the number of particles of the second metal 105 around the center portion. In such a state, the solder material 103 was rolled, so that, as shown in Table 2, 83.8 atomic % to 89.8 atomic % of the second metal 105 was disposed below the center portion of the semiconductor element 109, the thermal conductivity of the die bond joint at the origin O was 103 W/(m·K) to 158 W(m·K), and heat generated from the semiconductor element 109 during the operation of the IGBT was efficiently dissipated to the lead frame 101. Further, 121 W/(m·K) is the thermal conductivity of zinc, and 427 W/(m·K) is the thermal conductivity of silver.

Meanwhile, the product yields were lower in Comparative Examples for the following reason. In the manufacturing method of Comparative Examples, since the molten solder material was supplied, the solder material having particles of the second metal 105 with high thermal conductivities of 121 W/(m·K) to 427 W/(m·K) uniformly dispersed in the first metal 104 was rolled. Consequently, as shown in Table 2, only 2.4 atomic % to 5 atomic % of the second metal 105 was disposed below the center portion of the semiconductor element 109. When heat generated from the semiconductor element 109 during the operation of the IGBT was dissipated to the lead frame, the heat dissipation of bismuth, which was the main component of the solder material 103, with a thermal conductivity of 9.15 W/(m·K) significantly brought about such an effect that the highest thermal conductivity of the die bond joint was 9.7 W/(m·K) to 11 W/(m·K), lower than a thermal conductivity of Pb—3% by weight Sn of 35 W/(m·K). The Pb—3% by weight Sn is used as an existing solder material for die bonding. Heat generated from the semiconductor element 109 was not sufficiently dissipated, and the temperature of the semiconductor element 109 was higher than the operating limit temperature.

In Examples, one or two were selected as the second metal 105 from silver, copper, and zinc but one or two may be selected as the second metal 105 from gold and aluminum. This is because the melting points of gold and aluminum are 1064° C. and 660° C., respectively, higher than the melting point of bismuth, 271° C., and the thermal conductivities of gold and aluminum are 317 W/(m·K) and 237 W(m·K), respectively, higher than the thermal conductivity of lead, 35 W/(m·K).

Further, in Examples, in order to determine the ratio of the first metal 104 to the second metal 105, the outer shape of the center portion of the die bond joint was set to be quadrangular. However, a region of the die bond joint which has an area about half the boundary surface of the die bond joint and the semiconductor element 109 and is centered around a position where the sphere-shaped solder material 103 is placed may be set as the central portion, and the outer shape of the center portion is not limited to a quadrangle.

In Examples, the IGBT power module, which is a power semiconductor device used for a power supply unit, was manufactured. The application of the present invention is not limited to the IGBT power module. Further, the silicon semiconductor element was used in Examples but the application of the present invention is not limited to the silicon semiconductor element. The present invention is also applicable to, for example, a gallium nitride semiconductor element and a silicon carbide semiconductor element.

In the above-described embodiment, the semiconductor device with a single semiconductor element mounted on the supporting board was described, but the present invention is also applicable to a semiconductor device with, for example, LSI having a plurality of functional blocks (CPU unit, RAM unit, ROM unit, IO unit, power supply unit) as the semiconductor element 109 mounted on a supporting board. When LSI is mounted, a plurality of heat sources are scattered. Thus, solder materials 103 are disposed below the heat sources. In this case, a solder material having a smaller diameter than the solder material of the above-described embodiment is used.

INDUSTRIAL APPLICABILITY

The semiconductor device according to the present invention can improve heat dissipation from the semiconductor element to the supporting board while securing sufficient joint strength between the semiconductor element and the supporting board, and increase the product yield. The semiconductor device according to the present invention is expected to be applied to semiconductor packages such as a power semiconductor device and a low power transistor.

The invention claimed is:

1. A semiconductor device comprising:
a supporting board;
an electrode surface processing layer formed on the supporting board;
a semiconductor element; and
a solder material containing a first metal composed mainly of bismuth and a second metal having a higher melting point than the first metal and joining the electrode surface processing layer and the semiconductor element, the solder material containing particles of the second metal inside the first metal,
wherein a composition ratio of the second metal is higher than the first metal in a region of the solder material corresponding to a center portion of the semiconductor element, a composition ratio of the first metal is higher than the second metal in a region of the solder material outside the region corresponding to the center portion, and the composition ratio of the second metal is at least 83.8 atomic percent in the region corresponding to the center portion, and
a thermal conductivity of the second metal is not lower than 35 W/(m·K).

2. The semiconductor device according to claim 1, wherein when an outer shape of a surface of the semiconductor element facing the electrode surface processing layer is quadrangular,
lengths of two sides opposed to each other in one direction are referred to as 2A, and lengths of two sides opposed to each other in another direction are referred to as 2B in the outer shape,
a straight line connecting midpoints of the two sides with length 2B is set as an X-axis, and a straight line connecting midpoints of the two sides with length 2A is set as a Y-axis, and
an intersection of the X-axis and the Y-axis is set as an origin to form an X-Y coordinate plane,
the center portion of the semiconductor element is defined by $-7A/10 \leq x \leq 7A/10$, $-7B/10 \leq y \leq 7B/10$ in the X-Y coordinate plane.

3. The semiconductor device according to claim 1, wherein a thermal conductivity of the second metal is not higher than 427 W/(m·K), and a melting point of the second metal is not lower than 420° C. but not higher than 1083° C.

4. The semiconductor device according to claim 1, wherein at least one is selected from silver, copper, gold, aluminum, and zinc as the second metal.

5. The semiconductor device according to claim 4, wherein copper is selected as the second metal, and the composition ratio of the second metal is at least 84.1 atomic percent in the region corresponding to the center portion.

6. The semiconductor device according to claim 4, wherein copper and silver are selected as the second metal, and the composition ratio of the second metal is at least 84.7 atomic percent in the region corresponding to the center portion.

* * * * *